(12) United States Patent
Noh

(10) Patent No.: US 12,148,709 B2
(45) Date of Patent: Nov. 19, 2024

(54) MEMORY DEVICE AND METHOD OF MANUFACTURING THE SAME

(71) Applicant: SK hynix Inc., Icheon-si (KR)

(72) Inventor: Yoo Hyun Noh, Icheon-si (KR)

(73) Assignee: SK hynix Inc., Icheon-si (KR)

(*) Notice: Subject to any disclaimer, the term of this patent is extended or adjusted under 35 U.S.C. 154(b) by 546 days.

(21) Appl. No.: 17/468,344

(22) Filed: Sep. 7, 2021

(65) Prior Publication Data
US 2022/0285285 A1 Sep. 8, 2022

(30) Foreign Application Priority Data

Mar. 4, 2021 (KR) .......................... 10-2021-0028918

(51) Int. Cl.
| | | |
|---|---|---|
| *H01L 23/544* | (2006.01) | |
| *H10B 43/10* | (2023.01) | |
| *H10B 43/27* | (2023.01) | |
| *H10B 43/35* | (2023.01) | |

(52) U.S. Cl.
CPC .......... *H01L 23/544* (2013.01); *H10B 43/10* (2023.02); *H10B 43/27* (2023.02); *H10B 43/35* (2023.02); *H01L 2223/54426* (2013.01)

(58) Field of Classification Search
CPC ....... H01L 23/544; H10B 43/35; H10B 43/10; H10B 43/27
See application file for complete search history.

(56) References Cited

U.S. PATENT DOCUMENTS

| | | | |
|---|---|---|---|
| 2006/0102980 A1 | 5/2006 | Nakashiba | |
| 2013/0037968 A1* | 2/2013 | Ishida | H01L 23/564 |
| | | | 257/E23.179 |
| 2015/0155351 A1* | 6/2015 | Kim | H01L 23/5225 |
| | | | 257/491 |
| 2017/0062462 A1 | 3/2017 | Lee | |
| 2017/0162594 A1 | 6/2017 | Ahn | |
| 2018/0315723 A1* | 11/2018 | Singh | G06F 30/398 |
| 2020/0126930 A1 | 4/2020 | Cho et al. | |
| 2020/0135754 A1 | 4/2020 | Lee | |
| 2022/0223485 A1* | 7/2022 | Choi | H01L 22/32 |
| 2022/0238644 A1* | 7/2022 | Yang | H01L 29/0653 |

FOREIGN PATENT DOCUMENTS

| | | |
|---|---|---|
| CN | 106952926 A | 7/2017 |
| CN | 108788486 A | 11/2018 |
| CN | 109346469 A | 2/2019 |
| CN | 111223872 A | 6/2020 |
| KR | 1020020026995 A | 4/2002 |
| KR | 100781850 B1 | 12/2007 |
| TW | 202015117 A | 4/2020 |

* cited by examiner

*Primary Examiner* — Christine A Enad
(74) *Attorney, Agent, or Firm* — WILLIAM PARK & ASSOCIATES LTD.

(57) ABSTRACT

The present technology relates to a memory device and a method of manufacturing the same. A memory device according to an embodiment of the present disclosure includes a main chip region, a chip guard region disposed adjacent to the main chip region, a plurality of chip guard patterns formed in the chip guard region, and a buffer slit formed in a space between the plurality of chip guard patterns.

9 Claims, 18 Drawing Sheets

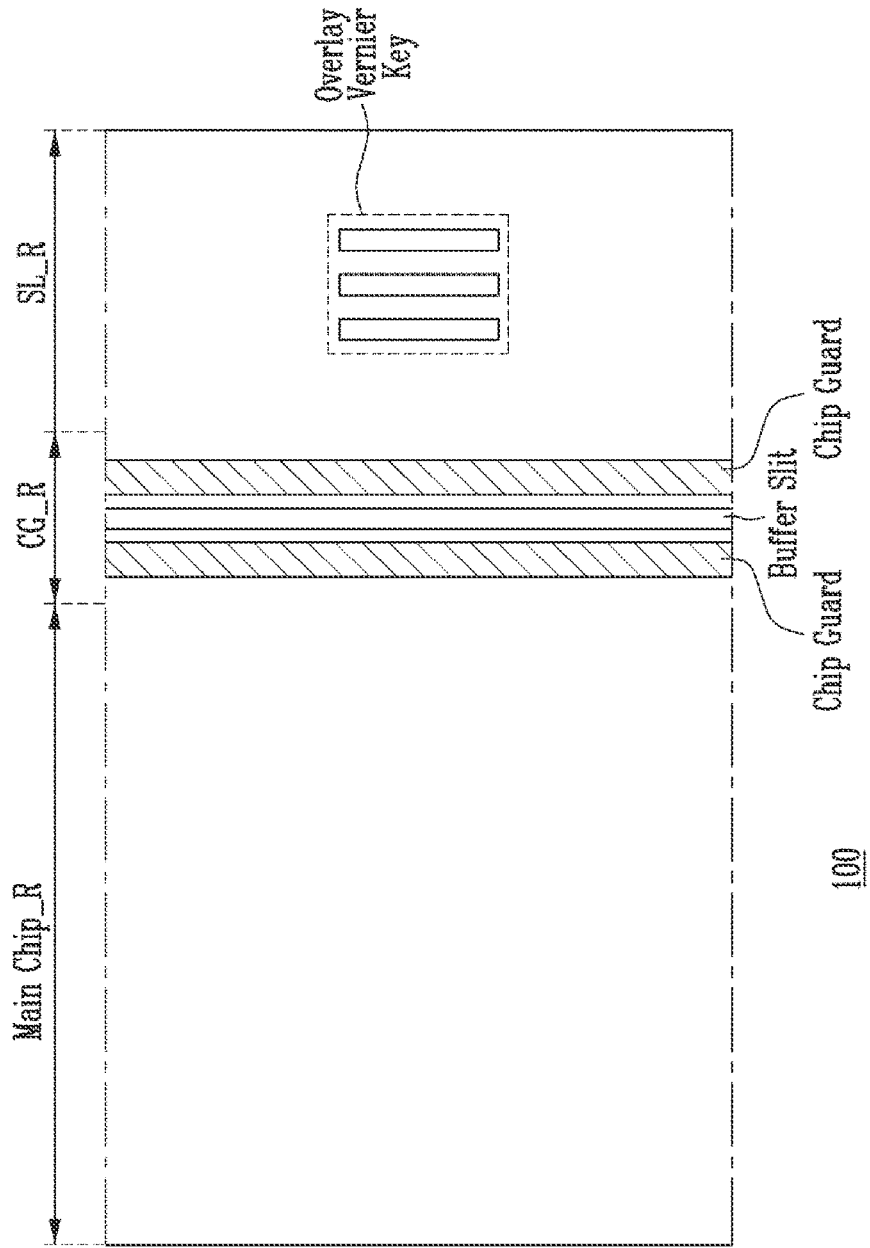

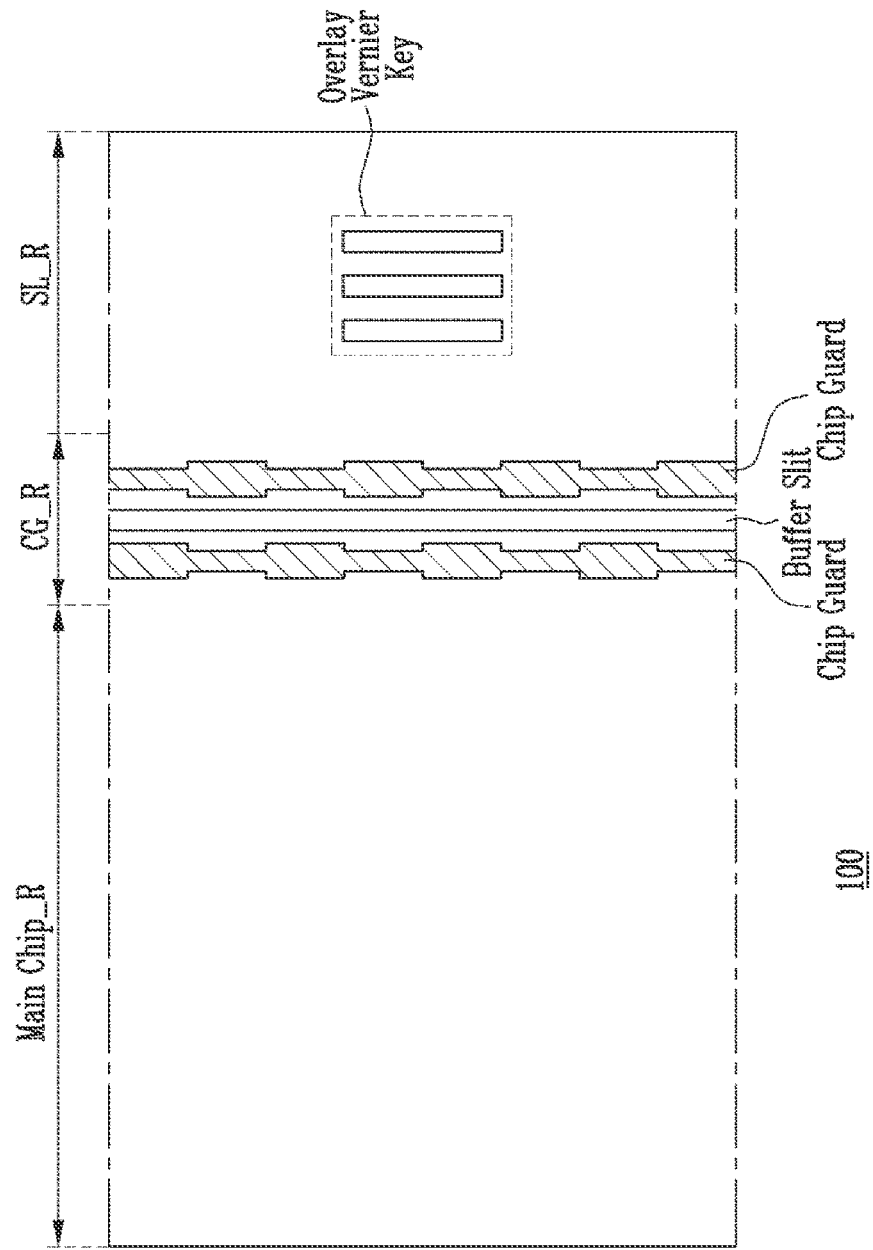

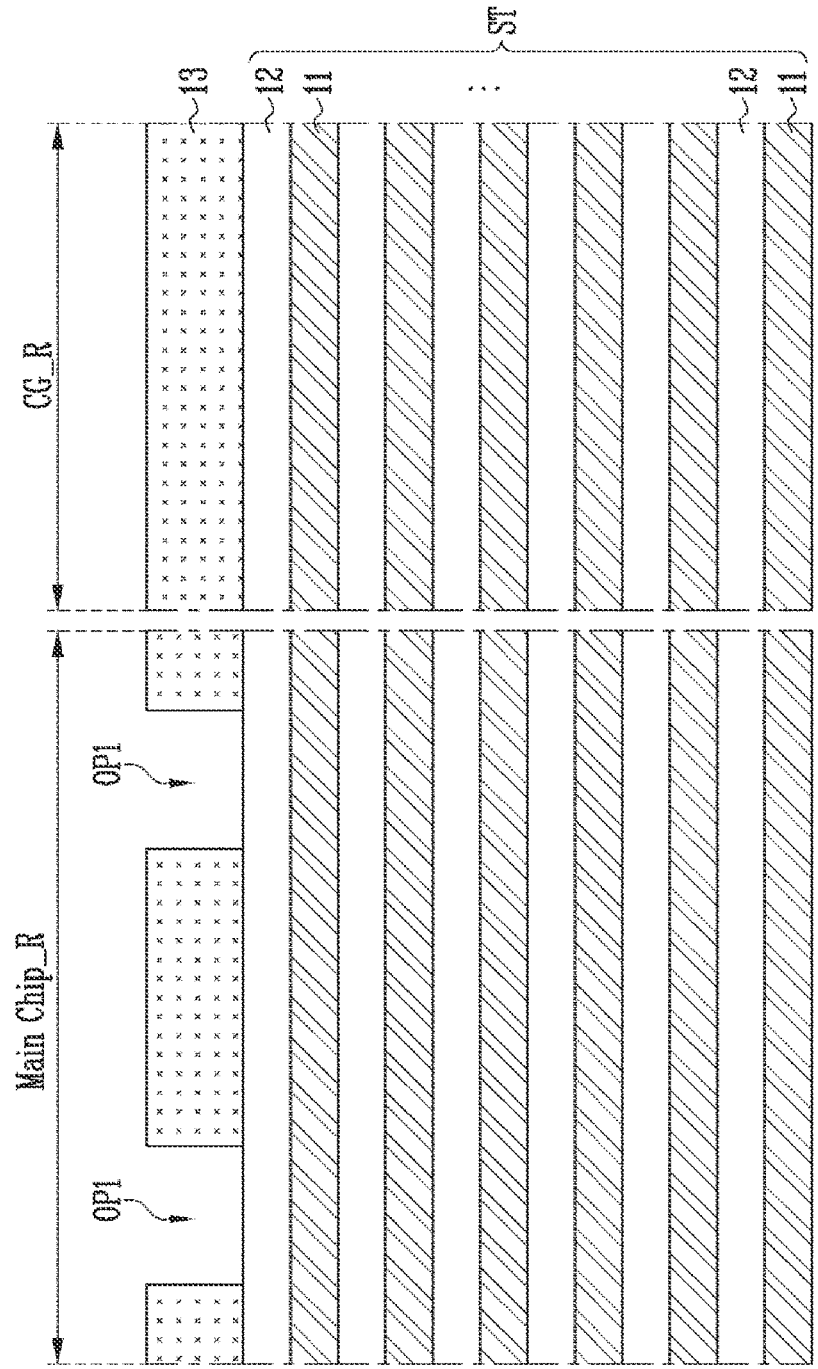

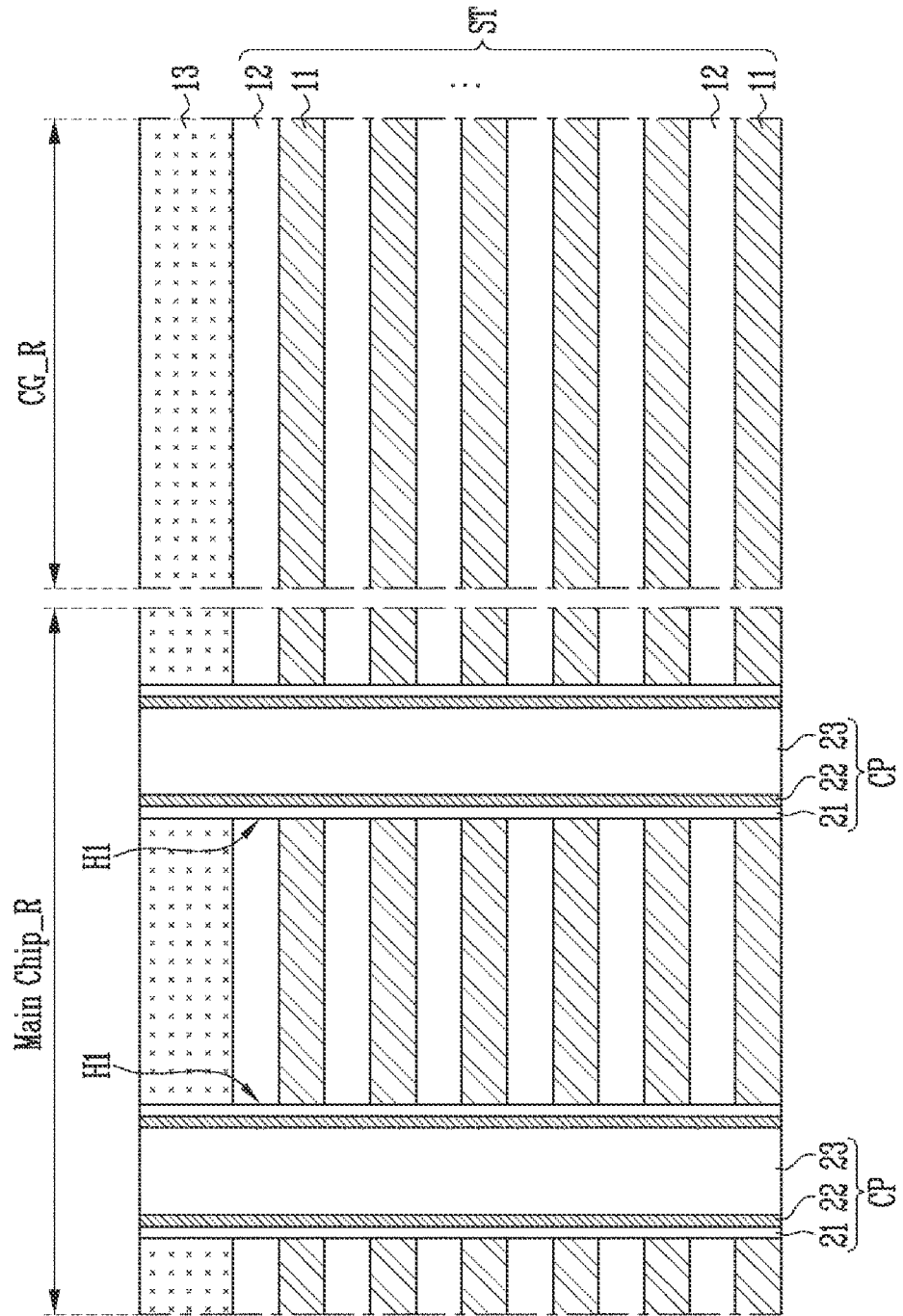

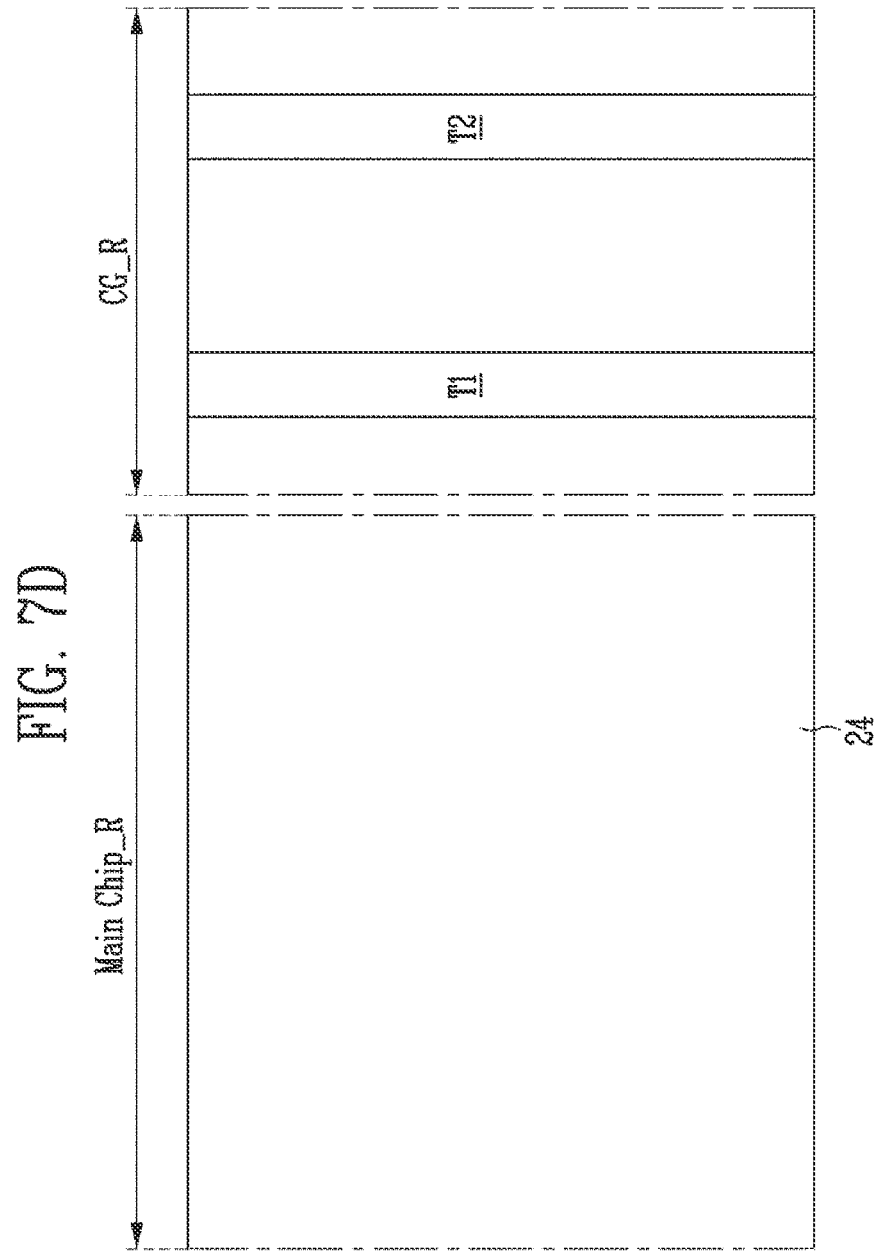

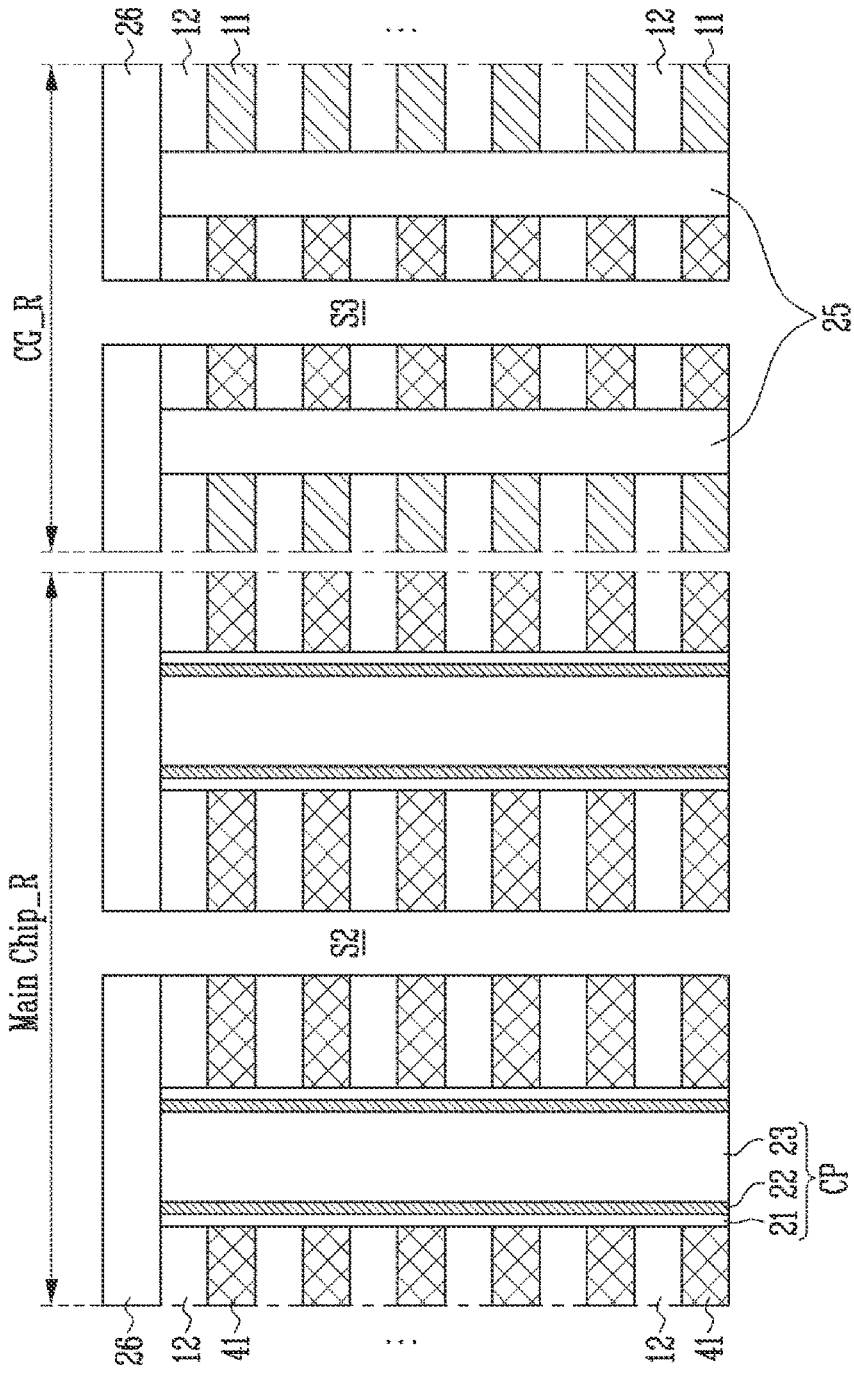

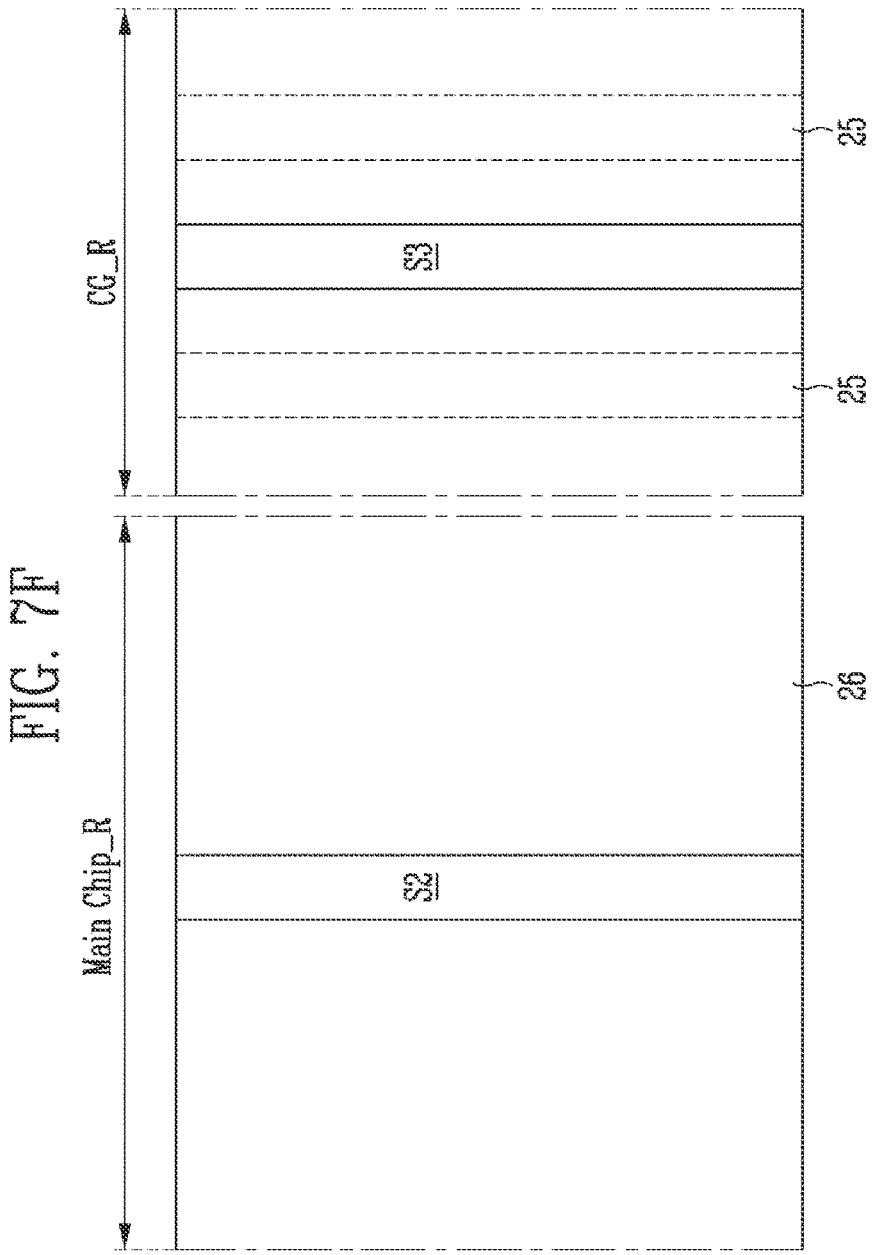

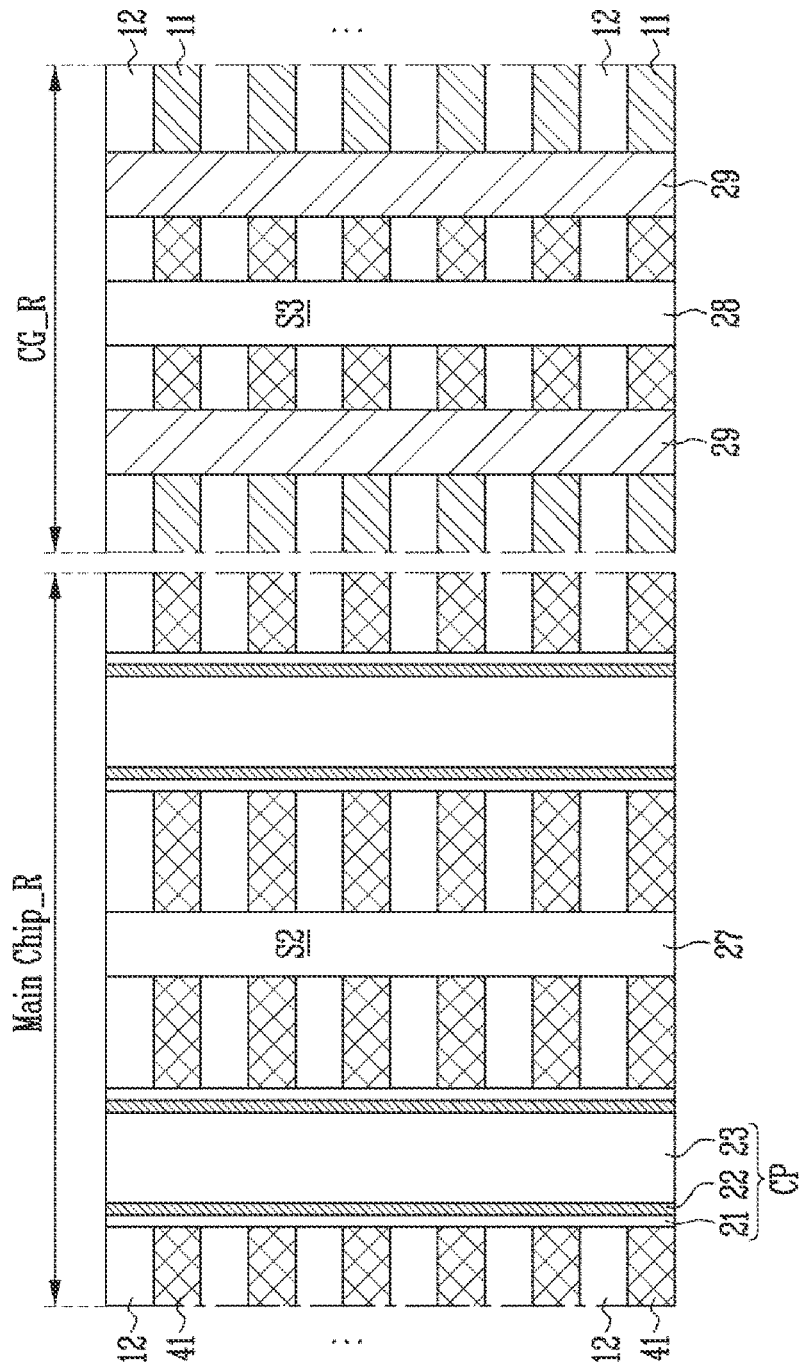

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2021-0028918 filed on Mar. 4, 2021, in the Korean Intellectual Property Office, the entire disclosure of which is incorporated by reference herein.

BACKGROUND

1. Technical Field

The present disclosure relates to a memory device and a method of manufacturing the same, and more particularly, to a three-dimensional memory device and a method of manufacturing the same.

2. Related Art

Recently, a paradigm for a computer environment has been transformed into ubiquitous computing, which enables a computer system to be used whenever and wherever. Therefore, the use of portable electronic devices, such as mobile phones, digital cameras, and notebook computers is rapidly increasing. Such a portable electronic device generally uses a memory system that uses a memory device, that is, a data storage device. The data storage device is used as a main storage device or an auxiliary storage device of the portable electronic device.

The data storage device that uses a memory device has advantages of stability and durability because there is no mechanical driver. Furthermore, the access speed of information is very fast, and power consumption is low. As examples of a memory system with such advantages, a data storage device includes a universal serial bus (USB) memory device, a memory card with various interfaces, a solid state drive (SSD), and the like.

A memory device is largely divided into a volatile memory device and a nonvolatile memory device.

The write speed and the read speed of the nonvolatile memory device are relatively slow. However, the nonvolatile memory device maintains storage data even though power supply is shut off. Therefore, a nonvolatile memory device is used to store data to be maintained regardless of power supply. A nonvolatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

Recently, as an integration degree of a two-dimensional nonvolatile memory device that forms a memory cell in a single layer on a substrate reaches its limit, a three-dimensional nonvolatile memory device that vertically stacks memory cells on a substrate is being proposed.

The three-dimensional nonvolatile memory device includes interlayer insulating layers and gate electrodes that are alternately stacked, channel layers that pass through the interlayer insulating layers and the gate electrodes, and memory cells are stacked along the channel layers. Various structures and manufacturing methods are being developed to improve operation reliability and a manufacturing yield of the nonvolatile memory device with such a three-dimensional structure.

SUMMARY

According to an embodiment of the present disclosure, a memory device includes a main chip region, a chip guard region disposed adjacent to the main chip region, a plurality of chip guard patterns formed in the chip guard region, and a buffer slit formed in a space between the plurality of chip guard patterns.

According to an embodiment of the present disclosure, a method of manufacturing a memory device includes forming a stack in which a plurality of sacrificial layers and a plurality of interlayer insulating layers are alternately stacked on a substrate in a main chip region, a scribe region, and a chip guard region between the main chip region and the scribe region, forming a plurality of trenches that pass through the stack in the chip guard region, forming sacrificial patterns in the plurality of trenches, forming a slit that passes through the stack in a space between the plurality of trenches, removing the sacrificial layers that are exposed through the slit and forming a plurality of plate electrodes in a space from which the sacrificial layers are removed, removing the sacrificial patterns and forming chip guard patterns in a space from which the sacrificial patterns are removed, and forming a buffer slit in the slit.

According to an embodiment of the present disclosure, a method of manufacturing a memory device includes forming a stack in which a plurality of sacrificial layers and a plurality of interlayer insulating layers are alternately stacked on a substrate in a main chip region and a chip guard region, forming a plurality of trenches that pass through the stack in the chip guard region, forming sacrificial patterns in the plurality of trenches, forming a plurality of first slits that pass through the stack on the main chip region and forming a second slit that passes through the stack in a space between the plurality of trenches, removing the sacrificial layers that are exposed through the first slits and the second slits and then forming a plurality of plate electrodes in a space from which the sacrificial layers are removed, forming a plurality of chip guard patterns by filling each of the plurality of trenches with a conductive material after removing the sacrificial patterns, and forming a buffer slit in the second slit.

BRIEF DESCRIPTION OF THE DRAWINGS

FIGS. 5A and 5B are plan and cross-sectional views illustrating a memory device according to an embodiment of the present disclosure.

FIG. 6 is a plan view illustrating a memory device according to another embodiment of the present disclosure.

FIGS. 7A to 7H are plan and cross-sectional views illustrating a method of manufacturing a memory device according to an embodiment of the present disclosure.

DETAILED DESCRIPTION

Figure 1:
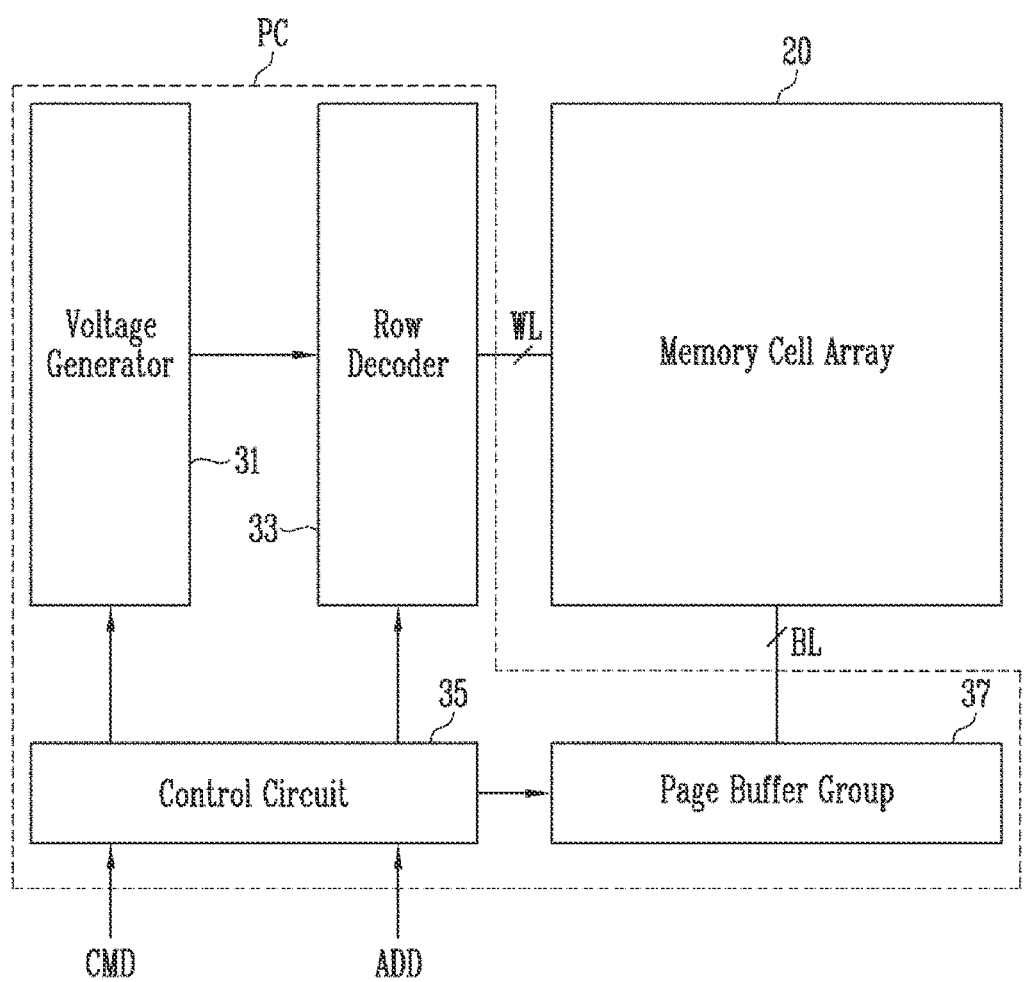
FIG. 1 is a block diagram illustrating a memory device according to an embodiment of the present disclosure.

Hereinafter, the most preferred embodiment of the present disclosure is described. In the drawings, a thickness and a distance are expressed for convenience of description, and may be exaggerated compared to an actual physical thickness. In describing the present disclosure, a well-known configuration irrelevant to the gist of the present disclosure may be omitted. In adding reference numerals to components of each drawing, it should be noted that only the same components have the same number as possible, even though the components are indicated on different drawings.

An embodiment of the present disclosure provides a memory device with an easy manufacturing process and a stable structure, and a method of manufacturing the same.

According to the present technology, a crack due to chip stress and a defect of an overlay vertical key formed on the scribe region may be improved by forming the chip guard patterns in the chip guard region between the main chip region and the scribe region and forming the buffer slit in the space between the chip guard patterns.

FIG. 1 is a block diagram illustrating a memory device according to an embodiment of the present disclosure.

Referring to FIG. 1, the memory device 10 may include a peripheral circuit PC and a memory cell array 20.

The peripheral circuit PC may be configured to perform a program operation for storing data in the memory cell array 20, a read operation for outputting data that is stored in the memory cell array 20, and an erase operation for erasing data that is stored in the memory cell array 20.

As an embodiment, the peripheral circuit PC may include a voltage generator 31, a row decoder 33, a control circuit 35, and a page buffer group 37.

The memory cell array 20 may include a plurality of memory blocks, and each of the plurality of memory blocks may include a plurality of memory cells in which data is stored.

The memory cell array 20 may be connected to the row decoder 33 through word lines WL and may be connected to the page buffer group 37 through bit lines BL.

The control circuit 35 may control the peripheral circuit PC in response to a command CMD and an address ADD.

The voltage generator 31 may generate various operation voltages that are used for the program operation, the read operation, and the erase operation in response to control of the control logic 35. The operation voltages may include a program voltage, a verify voltage, a pass voltage, a read voltage, an erase voltage, and the like.

The row decoder 33 may provide the operation voltages generated by the voltage generator 31 to the memory cell array 20 in response to the control logic 35. For example, the row decoder 33 may provide the operation voltages that are generated by the voltage generator 31 to at least one memory block that is selected from among the plurality of memory blocks that are included in the memory cell array 20.

The page buffer group 37 may be connected to the memory cell array 20 through the bit lines BL. The page buffer group 37 may temporarily store data that is received from an input/output circuit (not shown) during the program operation in response to the control circuit 35, and control a potential of the bit lines BL based on the temporarily stored data. The page buffer group 37 may sense a voltage or a current of the bit lines BL during the read operation or the verify operation in response to the control circuit 35.

Structurally, the memory cell array 20 may be disposed on the peripheral circuit PC. The memory cell array 20 may overlap a portion of the peripheral circuit PC.

Figure 2:
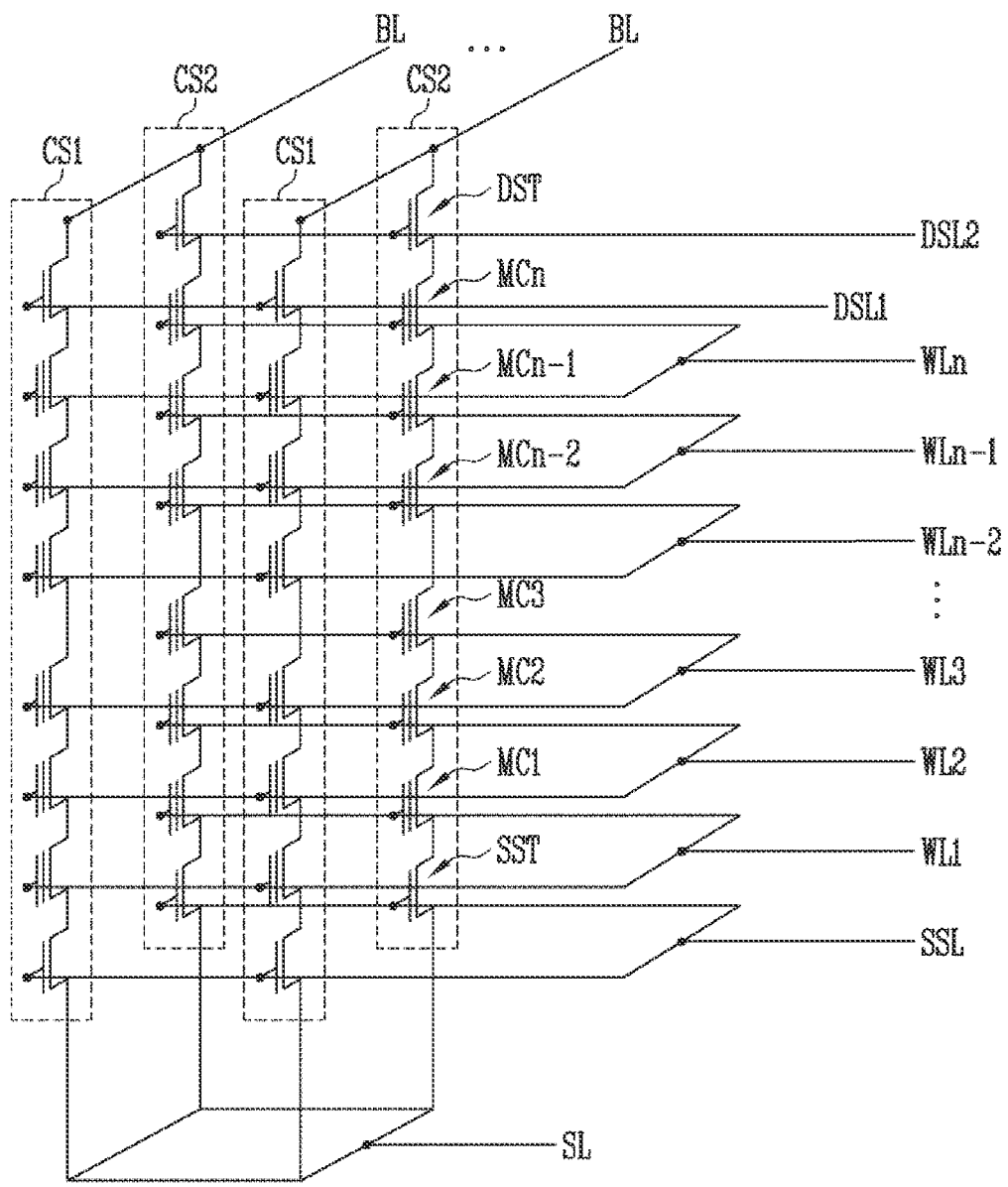
FIG. 2 is a circuit diagram illustrating a memory cell array according to an embodiment of the present disclosure.

FIG. 2 is a circuit diagram illustrating the memory cell array according to an embodiment of the present disclosure.

Referring to FIG. 2, the memory cell array 20 may include a plurality of cell strings CS1 and CS2 connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST that is connected to the source line SL, at least one drain select transistor DST that is connected to the bit line BL, and a plurality of memory cells MC1 to MCn that are connected in series between the source select transistor SST and the drain select transistor DST.

The gates of the plurality of memory cells MC1 to MCn may be respectively connected to the plurality of word lines WL1 to WLn that are spaced apart from each other and stacked. The plurality of word lines WL1 to WLn may be disposed between a source select line SSL and two or more drain select lines DSL1 and DSL2. The two or more drain select lines DSL1 and DSL2 may be spaced apart from each other at the same level.

The gate of the source select transistor SST may be connected to the source select line SSL. The gate of the drain select transistor DST may be connected to a drain select line that corresponds to the gate of the drain select transistor DST.

The source line SL may be connected to the source of the source select transistor SST. The drain of the drain select transistor DST may be connected to a bit line that corresponds to the drain of the drain select transistor DST.

The plurality of cell strings CS1 and CS2 may be divided into string groups that are respectively connected to the two or more drain select lines DSL1 and DSL2. Cell strings that are connected to the same word line and the same bit line may be independently controlled by different drain select lines. In addition, cell strings that are connected to the same drain select line may be independently controlled by different bit lines.

As an embodiment, the two or more drain select lines DSL1 and DSL2 may include a first drain select line DSL1 and a second drain select line DSL2. The plurality of cell strings CS1 and CS2 may include a first cell string CS1 of a first string group connected to the first drain select line DSL1 and a second string CS2 of a second string group connected to the second drain select line DSL2.

Figure 3:
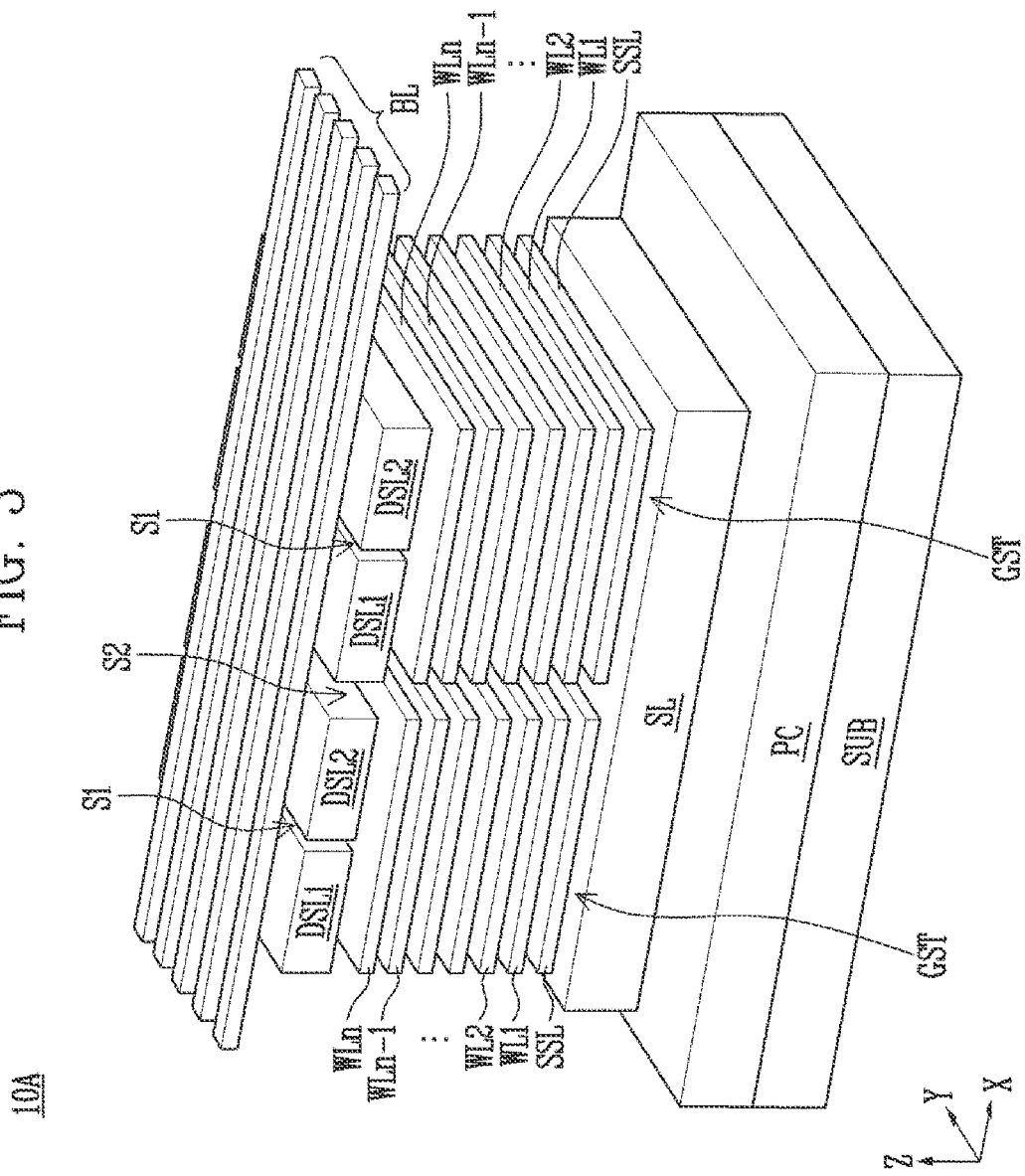
FIGS. 3 and 4 are perspective views illustrating a memory device according to an embodiment of the present disclosure.
Figure 4:
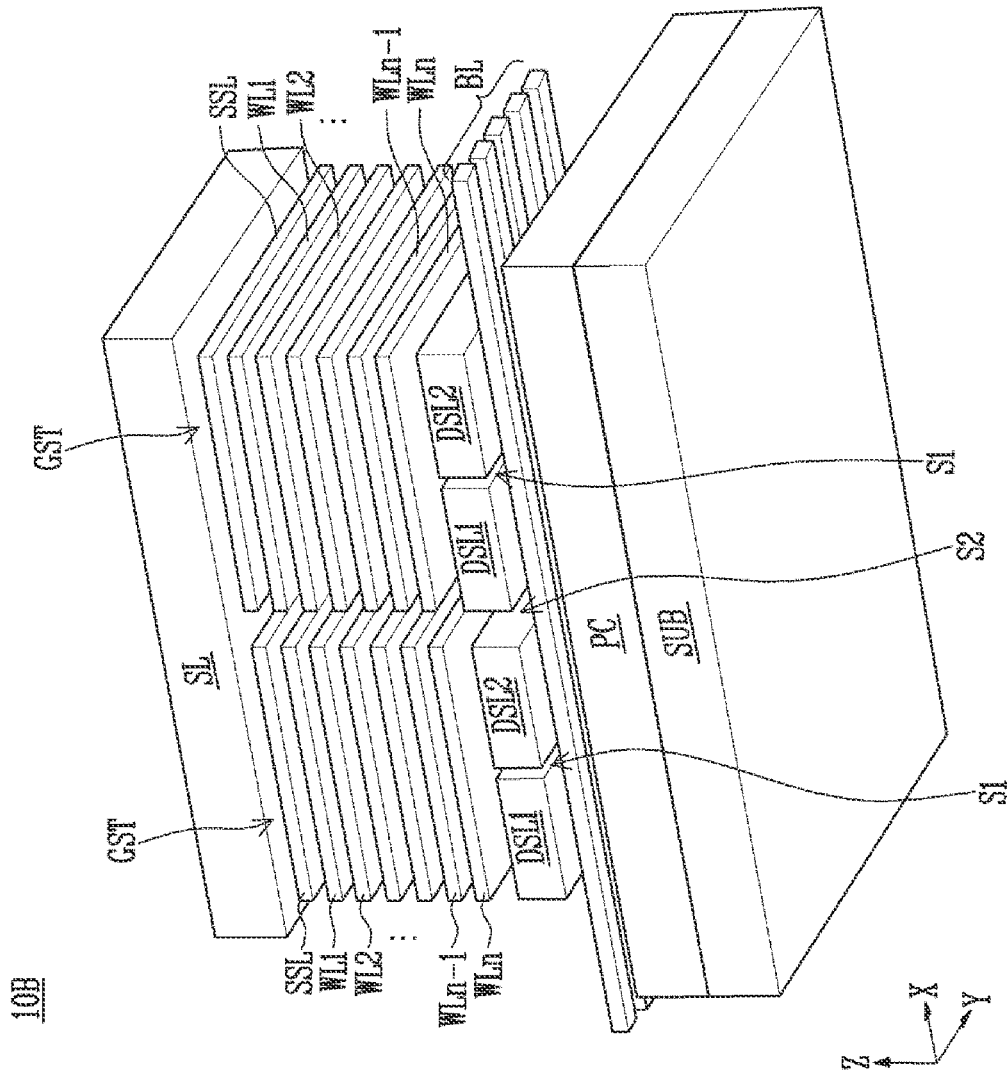

FIGS. 3 and 4 are perspective views illustrating a memory device according to an embodiment of the present disclosure.

Referring to FIGS. 3 and 4, each of the memory devices 10A and 10B may include the peripheral circuit PC that is disposed on a substrate SUB and gate stacks GST that overlap the peripheral circuit PC.

Each of the gate stacks GST may include the source select line SSL, the plurality of word lines WL1 to WLn, and the two or more drain select lines DSL1 and DSL2 that are separated from each other at the same level by a first slit S1.

The source select line SSL and the plurality of word lines WL1 to WLn may extend in a first direction X and a second direction Y and may be formed in a flat plate shape, parallel to an upper surface of the substrate SUB. The first direction X may be a direction in which an X-axis of an XYZ coordinate system is directed, and the second direction Y may be a direction in which a Y-axis of the XYZ coordinate system is directed.

The plurality of word lines WL1 to WLn may be spaced apart from each other and stacked in a third direction Z. The third direction Z may be a direction in which a Z axis of the XYZ coordinate system is directed. The plurality of word lines WL1 to WLn may be disposed between the two or more drain select lines DSL1 and DSL2 and the source select line SSL.

The gate stacks GST may be separated from each other by a second slit S2. The first slit S1 may be formed to be shorter in the third direction Z than the second slat S2 and may overlap the plurality of word lines WL1 to WLn.

Each of the first slit S1 and the second slit S2 may extend in a straight line, a zigzag shape, or a wave shape. Widths of each of the first slit S1 and the second slit S2 may be variously changed according to a design rule.

Referring to FIG. 3, the source select line SSL, according to an embodiment, may be disposed to be closer to the peripheral circuit PC than the two or more drain select lines DSL1 and DSL2.

The memory device 10A may include the source line SL that is disposed between the gate stacks GST and the peripheral circuit PC, and the plurality of bit lines BL that are spaced farther from the peripheral circuit PC than the source line SL. The gate stacks GST may be disposed between the plurality of bit lines BL and the source line SL.

Referring to FIG. 4, the two or more drain select lines DSL1 and DSL2, according to an embodiment, may be disposed to be closer to the peripheral circuit PC than the source select line SSL.

The memory device 10B may include the plurality of bit lines BL that are disposed between the gate stacks GST and the peripheral circuit PC and may include the source line SL that is farther from the peripheral circuit PC than the plurality of bit lines BL. The gate stacks GST may be disposed between the plurality of bit lines BL and the source line SL.

In the memory device of FIGS. 1 to 4, described above, the plurality of memory cells and the peripheral circuit may be formed in a main chip region of a wafer during a manufacturing process, and an overlay vernier key for aligning a plurality of masks that are used in the manufacturing process may be formed in a scribe line region, which is an edge region of the wafer.

Figure 5B:
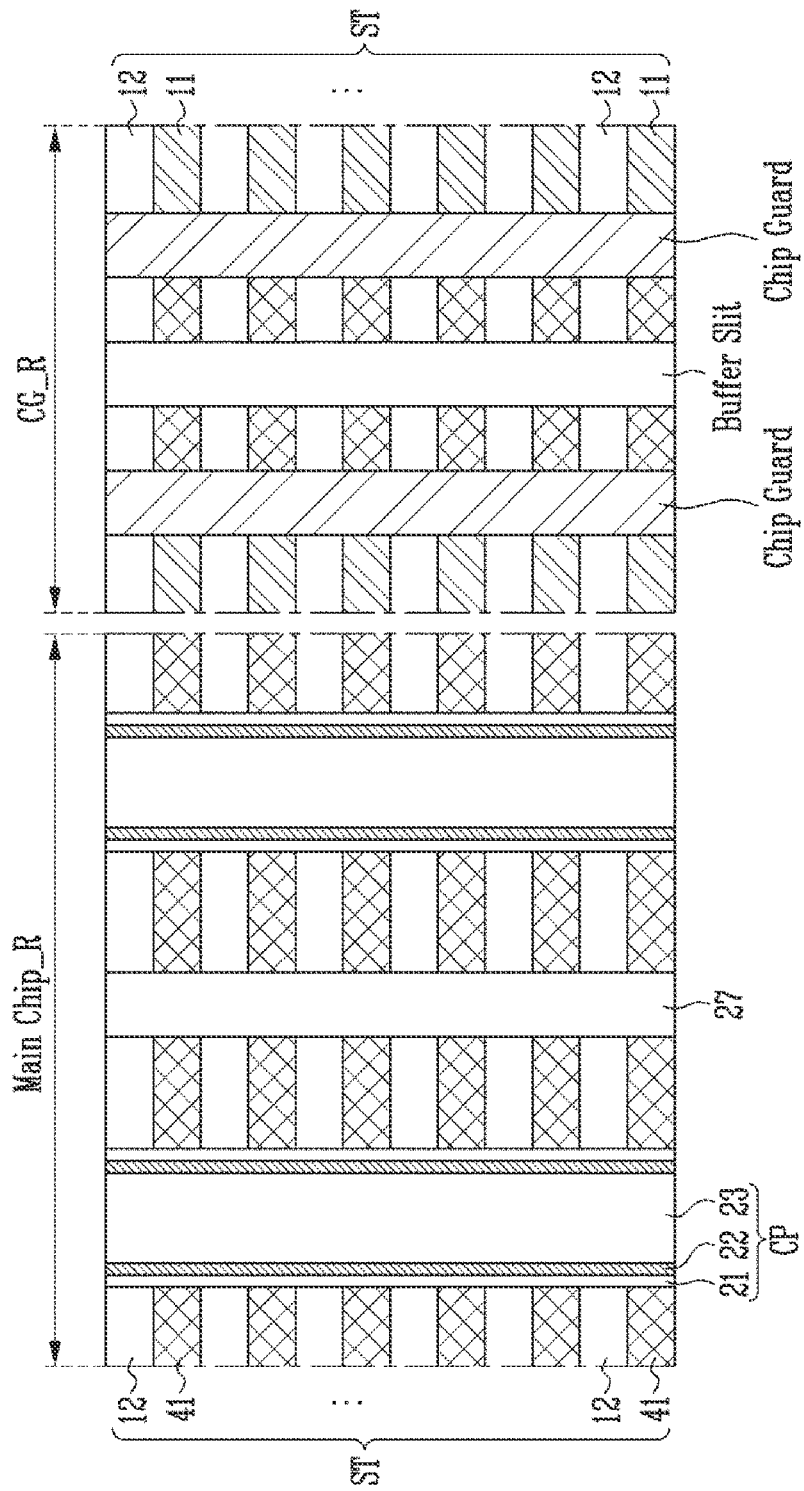

FIGS. 5A and 5B are plan and cross-sectional views illustrating a memory device according to an embodiment of the present disclosure.

Referring to FIG. 5A, the memory device 100 may be formed on a substrate that is defined as a main chip region Main Chip_R, a scribe line region and a chip guard region CG_R that is between the main chip region Main Chip_R and the scribe line region SL_R.

A plurality of memory cells and peripheral circuits for driving the plurality of memory cells may be formed on the substrate of the main chip region Main Chip_R.

An overlay vernier key Overlay Vernier Key for aligning a plurality of masks that are used in a manufacturing process of the memory device may be disposed on the scribe line region SL_R.

A plurality of chip guards Chip Guard may be disposed in the chip guard region CG_R between the main chip region Main Chip_R and the scribe line region SL_R, and a buffer slit Buffer Slit may be formed in a space between the plurality of chip guards Chip Guard.

The plurality of chip guards Chip Guard may be disposed in a line shape, parallel to each other. The plurality of chip guards Chip Guard may block a crack from spreading in the direction of the main chip region Main Chip_R during a sawing process of cutting the scribe line region SL_R and may block an impurity from flowing through an oxide layer that is exposed by a cut surface.

The buffer slit Buffer Slit may relieve stress that is generated in the main chip region Main Chip_R during the manufacturing process and may suppress misalignment of the overlay vernier key Overlay Vernier Key that is formed on the scribe line region SL_R due to the stress that is generated in the main chip region Main Chip_R.

Referring to FIG. 5B, in the main chip region Main Chip_R, a plurality of cell plugs CP that pass through a stack ST in which a plurality of interlayer insulating layers 12 and a plurality of plate electrodes 41 that are used as word lines are alternately stacked are formed. The plurality of cell plugs CP may include a memory layer 21, a channel layer 22, and a core insulating layer 23. A slit pattern 27 that electrically separates the plurality of plate electrodes 41 by passing through the stack ST may be formed between the plurality of cell plugs CP. The slit pattern 27 may correspond to the second slit S2 of FIG. 3 or 4 described above.

In the chip guard region CG_R that is adjacent to the main chip region Main Chip_R, the stack ST in which sacrificial layers 11 and the interlayer insulating layers 12 are alternately stacked and the plurality of chip guards Chip Guard that pass through the stack ST may be disposed. The plurality of chip guards Chip Guard may be formed together during a process of forming a contact plug (not shown) of the main chip region Main Chip_R. In addition, the buffer slit Buffer Slit that passes through the stack ST may be disposed in the space between the plurality of chip guards Chip Guard, and the buffer slit Buffer Slit may be formed together during a process of forming the slit pattern 27 of the main chip region Main Chip_R, In addition, the buffer slit Buffer Slit and the plurality of chip guards Chip Guard may be connected to each other through the plurality of plate electrodes 41.

FIG. 6 is a plan view illustrating a memory device according to another embodiment of the present disclosure.

In the above-described FIG. 5A, an example in which the plurality of chip guards Chip Guard are disposed in the chip guard region CG_R, and the plurality of chip guards Chip Guard are disposed in the parallel line shape.

The plurality of chip guards Chip Guard, according to an embodiment of the present disclosure, may be formed in various shapes. Referring to FIG. 6, each of the plurality of chip guards Chip Guard may have a concavoconvex portion and may be disposed to extend in one direction. A concave portion of each of the plurality of chip guards Chip Guard may be disposed to face a convex portion of an adjacent chip guard. The plurality of chip guards Chip Guard with the concavo-convex portion may disperse external stress compared to the line shape.

FIGS. 7A to 7H are plan and cross-sectional views illustrating a method of manufacturing a memory device according to an embodiment of the present disclosure.

In an embodiment of the present disclosure, a process of forming the plurality of cell plugs and the chip guard pattern on a substrate region including the main chip region Main Chip_R and the chip guard region CG_R is described. The main chip region Main Chip_R and the chip guard region CG_R may be adjacent to each other, and the chip guard region CG_R may be defined as a region between the main chip region Main Chip_R and the scribe line region.

Referring to FIG. 7A, the stack ST in which the sacrificial layers 11 and the interlayer insulating layers 12 are alternately stacked on the substrate (not shown) region including the main chip region Main Chip_R and the chip guard region CG_R may be formed. The stack ST may be formed on the substrate including the peripheral circuit.

The sacrificial layers 11 may be formed of a material that is different from that of the interlayer insulating layers 12. For example, the interlayer insulating layers 12 may be formed of an oxide, such as a silicon oxide layer. The sacrificial layers 11 may be formed of a material with an etch rate that is different from that of the interlayer insulating layers 12. For example, the sacrificial layers 11 may be formed of a nitride, such as a silicon nitride layer.

Thereafter, a first hard mask pattern 13 may be used to form a region OP1 in which the cell plugs are to be formed, the region OP1 being in the openings of the first hard mask pattern 13 in the main chip region Main Chip_R on the stack ST.

Referring to FIG. 7B, an etching process that uses the first hard mask pattern 13 may be performed to form a plurality of holes H1 that pass through the stack ST on the main chip region Main Chip_R. Thereafter, the cell plugs CP may be formed in the holes H1. The cell plugs CP may be formed by sequentially stacking the memory layer 21, the channel layer 22, and the core insulating layer 23 on a sidewall of the holes H1.

The memory layer 21 may be formed as multiple layers. For example, the memory layer 21 may include a blocking insulating layer, a charge storage layer, and a tunnel insulating layer. The blocking insulating layer may be formed on the sidewall of the holes H1. The blocking insulating layer may include an oxide layer that is capable of blocking a charge. As an embodiment, the blocking insulating layer may be formed of $Al_2O_3$. The charge storage layer may be formed on a sidewall of the blocking insulating layer. The charge storage layer may be formed of a charge trap layer, may be formed of a material layer with a conductive nanodot, or may be formed of a phase change material layer. For example, the charge storage layer may store changed data by using Fowler-Nordheim tunneling. To this end, the charge storage layer may be formed of a silicon nitride layer that is capable of charge trapping. The tunnel insulating layer may be formed on a sidewall of the charge storage layer. The tunnel insulating layer may be formed of a silicon oxide layer that is capable of charge tunneling.

The channel layer 22 may include a semiconductor layer. As an embodiment, the channel layer 22 may include silicon.

The core insulating layer 23 may be formed to fill a central region of the holes H1. The core insulating layer may be formed of an oxide layer.

Figure 7C:
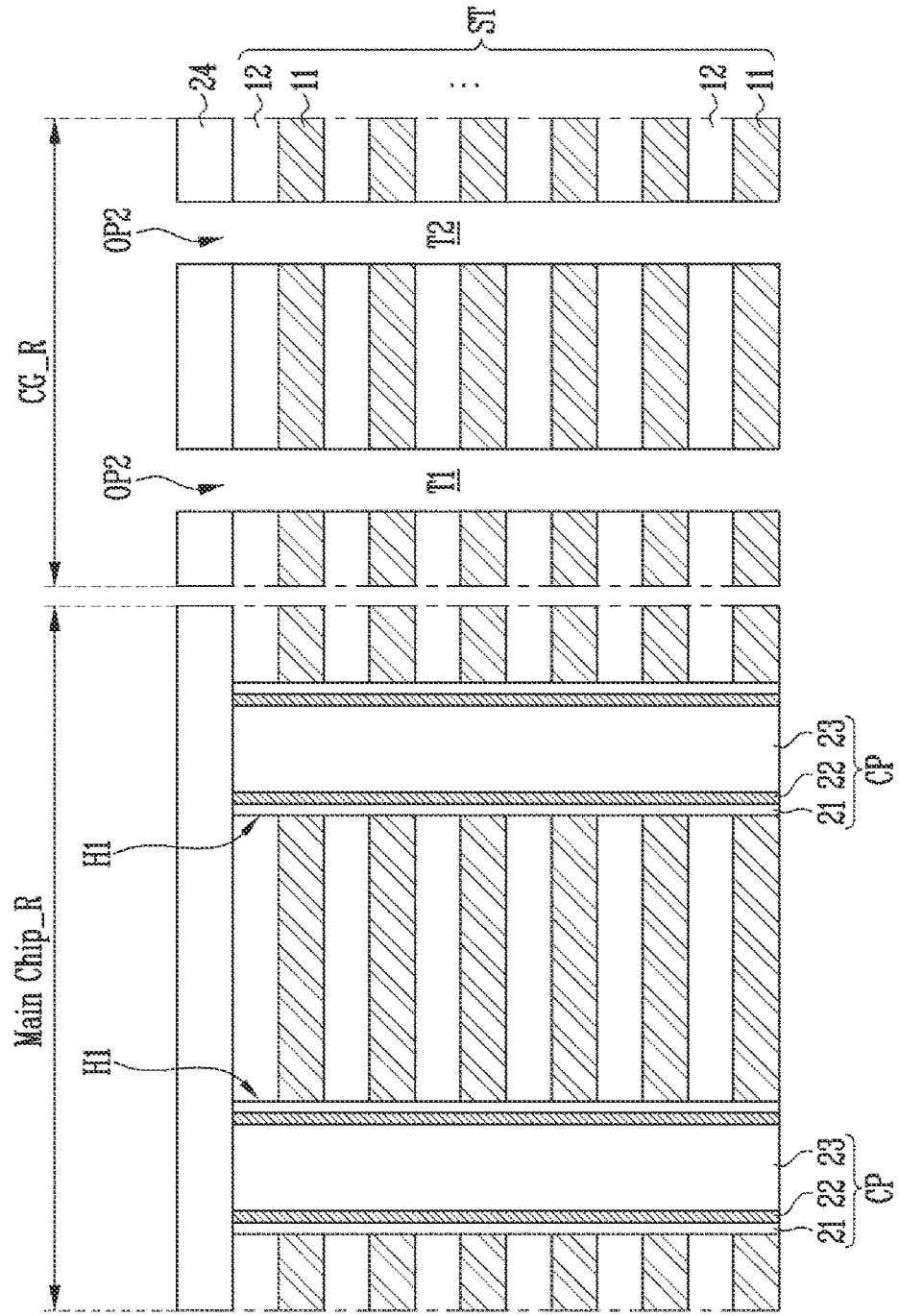

Referring to FIG. 7C, an upper portion of the cell plugs CP may be etched to a predetermined thickness. For example, the upper portion of the cell plugs CP may be etched to a predetermined thickness so that a height of an upper surface of the cell plugs CP1 is higher than an upper surface of the sacrificial layer 11 that is positioned at the highest portion and is equal to or lower than a height of an upper surface of the interlayer insulating layer 12 that is positioned at the highest portion.

Thereafter, the first hard mask pattern 13 may be removed, and a second hard mask pattern 24 may be used to form a region OP2 in which the chip guard pattern is to be formed, the region OP2 being in the openings of the second hard mask pattern 24 in the chip guard region CG_R on the stack ST.

At least two trenches T1 and T2 that pass through the stack ST in the chip guard region CG_R may be formed by performing an etching process using the second hard mask pattern 24. The at least two trenches T1 and T2 may be formed to be spaced apart from each other by a predetermined distance.

The contact plug (not shown) may be disposed under the at least two trenches T1 and T2 that pass through the stack ST in the chip guard region CG_R. That is, the at least two trenches T1 and T2 may be formed so that an upper portion of the contact plug that is formed on the substrate of the chip guard region CG_R is exposed.

FIG. 7D is a plan view of the memory device on which the process step shown in FIG. 7C is performed. Referring to FIG. 7D, the at least two trenches T1 and T2 may be spaced apart from each other by a predetermined distance in the chip guard region CG_R and may be disposed to be parallel to each other. The at least two trenches T1 and T2 may be disposed in a line shape parallel to each other.

In an embodiment of the present disclosure, an embodiment in which the at least two trenches T1 and 12 are formed in the parallel line shape is shown and described. However, when the plurality of chip guards are formed to have the concavoconvex portion, as shown in FIG. 6, the at least two trenches T1 and T2 may be formed to have a concavo-convex portion. That is, the at least two trenches T1 and T2 may extend in one direction, and a concave portion of the first trench T1 may be formed to face a convex portion of the adjacent second trench T2.

FIG. 7F is a plan view of the memory device on which the process step shown in FIG. 7E is performed. Referring to FIGS. 7E and 7F, at least two trenches formed in the chip guard region CG_R are filled with a sacrificial material layer to form the at least two sacrificial patterns 25. The sacrificial material layer may be an oxide layer.

Thereafter, a third hard mask pattern 26 may be formed on the main chip region Main Chip_R and the chip guard region CG_R. The third hard mask pattern 26 may be formed so that a region of the second slit S2, formed between the cell plugs CP and formed on the main chip region Main Chip_R, is opened. In addition, the third hard mask pattern 26 may be formed so that a space between the at least two sacrificial patterns 25 formed in the chip guard region CG_R is opened.

Thereafter, an etching process that uses the third hard mask pattern 26 may be performed to form the second slit S2 between the cell plugs CP that are formed on the main chip region Main Chip_R. The second slit S2 corresponds to the second slit S2 of FIG. 3 or 4. In addition, during the etching process for forming the second slit S2, the space between the at least two sacrificial patterns 25 of the chip guard region CG_R may be etched to form a third slit S3.

Thereafter, a heat treatment process may be performed to improve an etching damage that is generated due to the etching process, and stress may occur at each of the at least two sacrificial patterns 25 by expanding in a direction that is opposite to a stress direction that is generated in the main chip region Main Chip_R and the chip guard region CG_R during the heat treatment process, that is, a direction of the main chip region and a direction of the scribe region (not shown). Accordingly, each of the at least two sacrificial patterns 25 may relieve the stress that is generated in the main chip region and the scribe region.

Figure 7G:
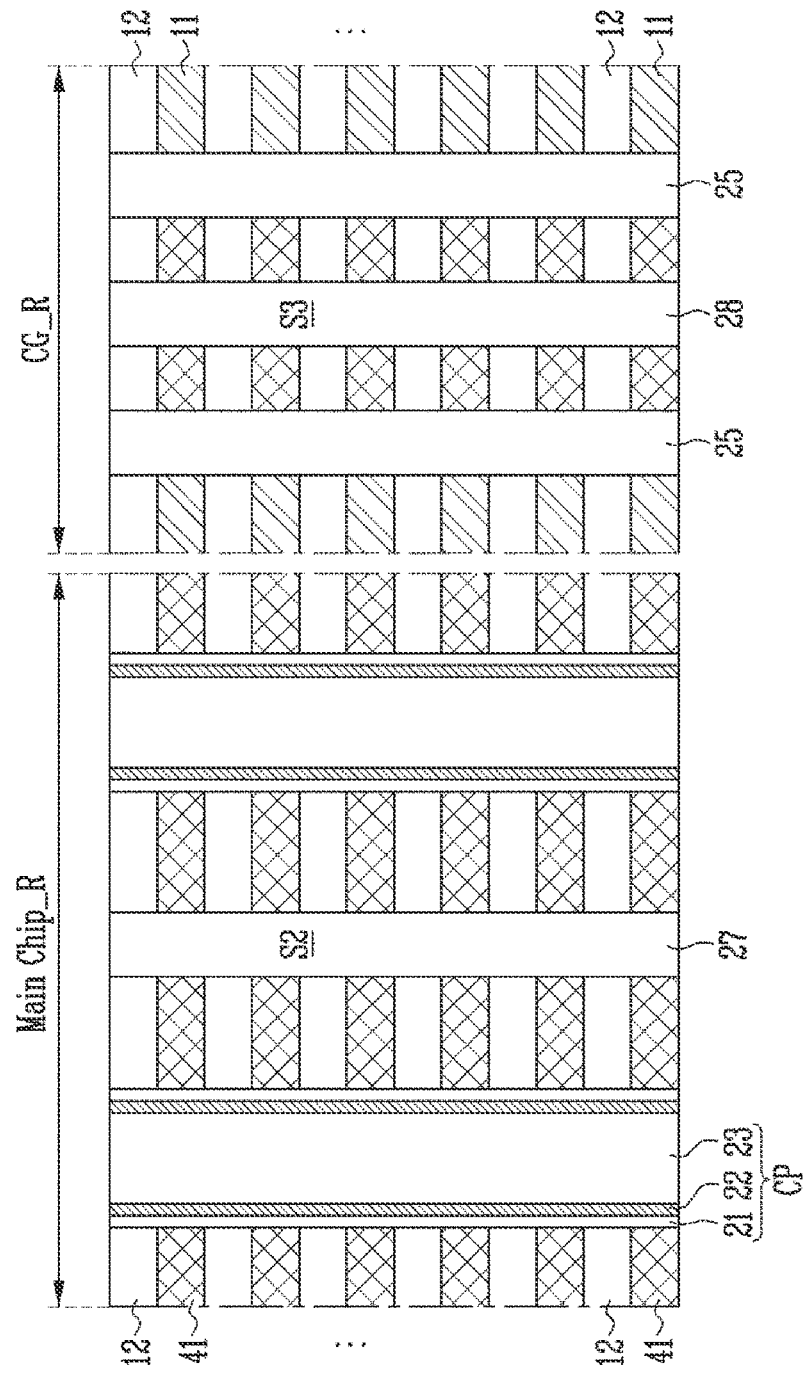

Referring to FIG. 7G, the sacrificial layers on the main chip region Main Chip_R that are exposed through the second slit S2 may be removed. In addition, the sacrificial layers between the sacrificial patterns 25 may be removed through the third slit S3.

Thereafter, the plate electrodes 41 may be formed by filling a space from which the sacrificial layers are removed with a conductive material for word lines.

Thereafter, the slit pattern 27 that insulates the plate electrodes 41 from each other may be formed by filling an insulating layer in the second slit S2, The slit pattern 27 may be formed of an oxide layer. In addition, the buffer slit 28 may be formed by filling a polysilicon layer in the third slit S3. As another example, the buffer slit 28 may be formed by filling an insulating layer in the third slit S3. In this case, the buffer slit 28 and the slit pattern 27 may be formed together by the same process.

Referring to FIG. 7H, at least two sacrificial patterns of the chip guard region CG_R may be removed. Thereafter, a chip guard pattern 29 may be formed by filling a space from which the at least two sacrificial patterns are removed with a conductive material. The chip guard patterns 29 that are adjacent to each other may be electrically connected to each other by the plate electrode 41 and the buffer slit S3.

According to the embodiment of the present disclosure described above, the plurality of chip guard patterns may be formed in the chip guard region between the main chip region and the scribe region, and the buffer slit may be formed between the chip guard patterns. Therefore, the stress of the main chip region that is generated during the manufacturing process may be prevented from spreading to the scribe region. In addition, the stress that is generated in the main chip region may be relieved by filling the oxide layer in the trench for forming the plurality of chip guard patterns.

Figure 8:
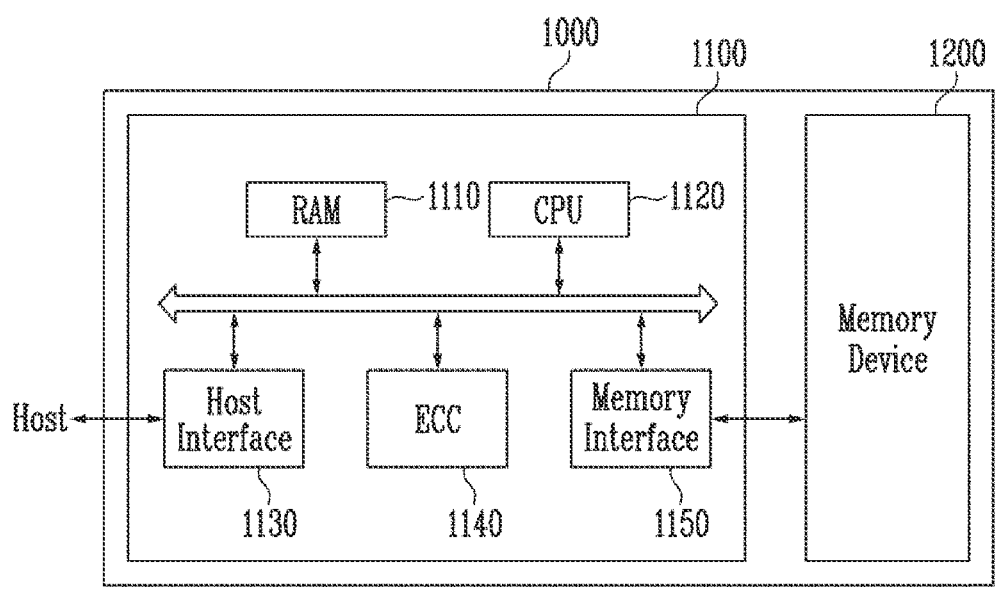
FIG. 8 is a block diagram illustrating a configuration of a memory system according to an embodiment of the present disclosure.

FIG. 8 is a block diagram illustrating a configuration of a memory system according to an embodiment of the present disclosure.

Referring to FIG. 8, the memory system 1000 according to an embodiment of the present disclosure includes a memory device 1200 and a controller 1100.

The memory device 1200 is used to store data information with various data types, such as a text, a graphic, and a software code. The memory device 1200 may be a nonvolatile memory and may be manufactured according to the method of manufacturing the memory device that is described above with reference to FIGS. 7A to 7H. Since a structure of the memory device 1200 and the method of manufacturing the memory device 1200 are the same as described above, a detailed description thereof is omitted.

The controller 1100 may be connected to a host and the memory device 1200 and is configured to access the memory device 1200 in response to a request from the host. For example, the controller 1100 may be configured to control read, write, erase, and background operations, and the like of the memory device 1200.

The controller 1100 may include a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 may be configured to control overall operation of the controller 1100, For example, the CPU 1120 may be configured to operate firmware, such as a flash translation layer (FTL) stored in the RAM 1110.

The host interface 1130 may be configured to perform interfacing with the host. For example, the controller 1100 may communicate with the host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 may be configured to perform interfacing with the memory device 1200. For example, the memory interface 1150 may include a NAND interface or a NOR interface.

For reference, the controller 1100 may further include a buffer memory (not shown) for temporarily storing data. Here, the buffer memory may be used to temporarily store data that is transferred to an external device through the host interface 1130, or to temporarily store data that is transferred from the memory device 1200 through the memory interface 1150. In addition, the controller 1100 may further include a ROM that stores code data for interfacing with the host.

As described above, since the memory system 1000 includes the memory device 1200 with an improved degree of integration and an improved characteristic, a degree of integration and a characteristic of the memory system 1000 may also be improved.

Figure 9:
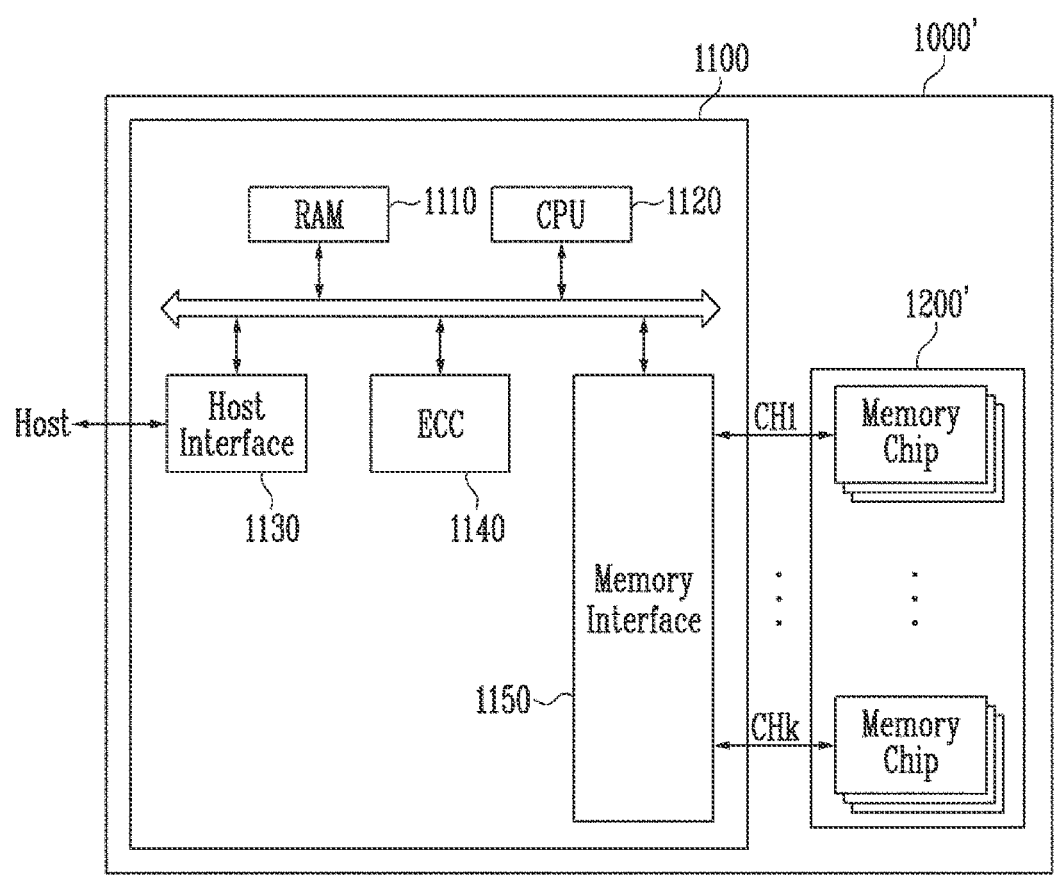
FIG. 9 is a block diagram illustrating a configuration of a memory system according to an embodiment of the present disclosure.

FIG. 9 is a block diagram illustrating a configuration of a memory system according to an embodiment of the present disclosure. Hereinafter, a description repetitive to the above description is omitted.

Referring to FIG. 9, the memory system 1000' may include a memory device 1200' and a controller 1100. In addition, the controller 1100 may include a RAM 1110, a CPU 1120, a host interface 1130, an ECC circuit 1140, a memory interface 1150, and the like.

The memory device 1200' may be a nonvolatile memory, and may be manufactured according to the method of manufacturing the memory device described above with reference to FIGS. 7A to 7H. Since a structure of the memory device 1200' and a method of manufacturing the memory device 1200' are the same as described above, a detailed description thereof is omitted.

In addition, the memory device 1200' may be a multi-chip package configured of a plurality of memory chips. The plurality of memory chips may be divided into a plurality of groups, and the plurality of groups may be configured to communicate with the controller 1100 through first to k-th channels CH1 to CHk. In addition, the memory chips that belong to one group may be configured to communicate with the controller 1100 through a common channel. For reference, the memory system 1000' may be modified such that one memory chip is connected to one channel.

As described above, since the memory system 1000' includes the memory device 1200' with an improved degree of integration and an improved characteristic, a degree of integration and a characteristic of the memory system 1000' may also be improved. In particular, by configuring the memory device 1200' in a multi-chip package, data storage capacity of the memory system 1000' may be increased and a driving speed may be improved.

Figure 10:
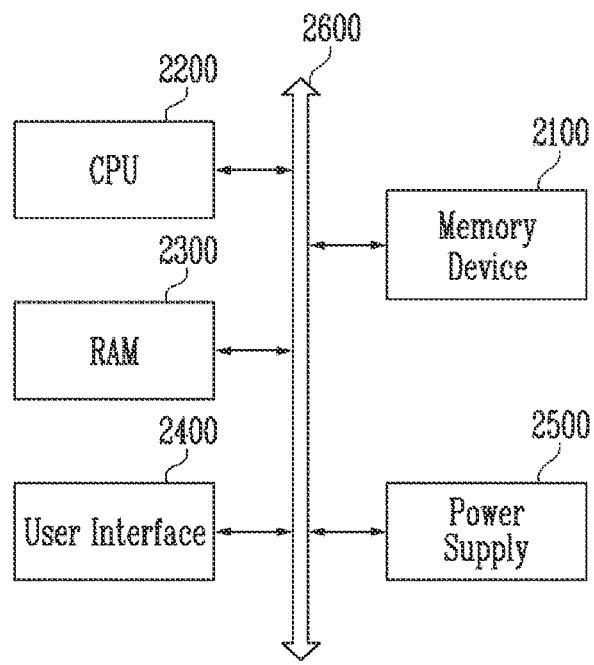
FIG. 10 is a block diagram illustrating a configuration of a computing system according to an embodiment of the present disclosure.

FIG. 10 is a block diagram illustrating a configuration of a computing system according to an embodiment of the present disclosure. Hereinafter, a description repetitive to the above description is omitted.

Referring to FIG. 10, the computing system 2000 may include a memory device 2100, a CPU 2200, a RAM 2300, a user interface 2400, a power supply 2500, a system bus 2600, and the like.

The memory device 2100 may store data provided through the user interface 2400, data processed by the CPU 2200, and the like. In addition, the memory device 2100 may be electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and the like.

Here, the memory device 2100 may be a nonvolatile memory and may be manufactured according to the method of manufacturing the memory device described above with reference to FIGS. 7A to 7H. Since the structure of the memory device 2100 and the method of manufacturing the memory device 2100 are the same as described above, a detailed description thereof is omitted.

In addition, the memory device 2100 may be a multi-chip package including a plurality of memory chips as described with reference to FIG. 9.

The computing system with such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, since the computing system 2000 includes the memory device 2100 with an improved degree of integration and an improved characteristic, a characteristic of the computing system 2000 may also be improved.

Figure 11:
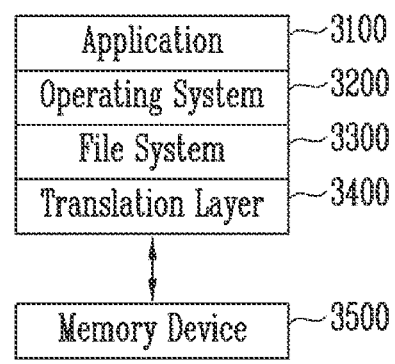
FIG. 11 is a block diagram illustrating a computing system according to an embodiment of the present disclosure.

FIG. 11 is a block diagram illustrating a computing system according to an embodiment of the present disclosure.

Referring to FIG. 11, the computing system 3000 may include a software layer including an operating system 3200, an application 3100, a file system 3300, a translation layer 3400, and the like. In addition, the computing system 3000 includes a hardware layer such as a memory device 3500.

The operating system 3200 may be for managing software, hardware resources, and the like of the computing system 3000, and may control program execution of a central processing unit. The application 3100 may be various application programs that are executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 as a Windows system of Microsoft company, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 may convert an address in a form that is suitable for the memory device 3500 in response to a request from the file system 3300. For example, the translation layer 3400 may convert a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory and may be manufactured according to the method of manufacturing the memory device described above with reference to FIGS. 7A to 7H. Since a structure of the memory device 3500 and a method of manufacturing the memory device 3500 are the same as described above, a detailed description thereof is omitted.

The computing system 3000 with such a configuration may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000. In addition, the translation layer 3400 may be included in the operating system layer or in the controller layer.

As described above, since the computing system 3000 includes the memory device 3500 with an improved degree of integration and an improved characteristic, a characteristic of the computing system 3000 may also be improved.

Although the technical spirit of the present disclosure is specifically recorded according to the above preferred embodiments, it should be noted that the above embodiments are for the purpose of description and not for a limitation thereof. In addition, those of ordinary skill in the technical field of the present disclosure may understand that various embodiments are possible within the scope of the technical spirit of the present disclosure.

What is claimed is:

1. A memory device comprising:
    a main chip region;
    a chip guard region disposed adjacent to the main chip region;

a plurality of chip guard patterns formed in the chip guard region; and a buffer slit formed in a space between the plurality of chip guard patterns, wherein a plurality of plate electrodes and a plurality of interlayer insulating layers are alternately stacked in spaces between the plurality of chip guard patterns in the chip guard region, and a plurality of sacrificial layers and the plurality of interlayer insulating layers are alternately stacked in other spaces in the chip guard region.

2. The memory device of claim 1, wherein the plurality of chip guard patterns have a line shape parallel to each other.

3. The memory device of claim 1, wherein each of the plurality of chip guard patterns has a concavo-convex portion and extends in one direction.

4. The memory device of claim 3, wherein a concave portion of each of the plurality of chip guard patterns faces a convex portion of an adjacent chip guard pattern.

5. The memory device of claim 1, further comprising:

a first stack in which the plurality of plate electrodes and the plurality of interlayer insulating layers are alternately stacked over the main chip region; and a plurality of cell plugs passing through the first stack in a vertical direction.

6. The memory device of claim 5, wherein each of the plurality of chip guard patterns passes through a portion at which a stack in which the plurality of plate electrodes and the plurality of interlayer insulating layers are alternately stacked and a stack in which the plurality of sacrificial layers and the plurality of interlayer insulating layers are alternately stacked are adjacent to each other in the chip guard region, in the vertical direction.

7. The memory device of claim 6, wherein the plurality of chip guard patterns are spaced apart from each other in a horizontal direction in the chip guard region.

8. The memory device of claim 7, wherein the buffer slit passes through the plurality of plate electrodes and the plurality of interlayer insulating layers that are stacked in the space between the plurality of chip guard patterns.

9. The memory device of claim 8, wherein the buffer slit is formed of a polysilicon layer.

* * * * *